United States Patent [19]
Fukumoto

[11] Patent Number: 5,287,319
[45] Date of Patent: Feb. 15, 1994

[54] NONVOLATILE SEMICONDUCTOR MEMORY DEVICE

[75] Inventor: Katsumi Fukumoto, Nara, Japan

[73] Assignee: Sharp Kabushiki Kaisha, Osaka, Japan

[21] Appl. No.: 704,425

[22] Filed: May 23, 1991

[30] Foreign Application Priority Data

May 23, 1990 [JP] Japan .................. 2-132965

[51] Int. Cl.$^5$ .............................. G11C 7/00
[52] U.S. Cl. ................... 365/222; 365/233
[58] Field of Search ................. 365/222, 233

[56] References Cited

U.S. PATENT DOCUMENTS 4,747,082 5/1988 Minato et al. ................ 365/222
4,827,453 5/1989 Sawada et al. ............... 365/222

OTHER PUBLICATIONS

U.S. application Ser. No. 07/549,293 Filed Jul. 6, 1990.
U.S. application Ser. No. 07/308,854 Filed Feb. 9, 1989.
U.S. application Ser. No. 07/644,332 Filed Jan. 18, 1991.
U.S. application Ser. No. 07/585,772 Filed Sep. 20, 1990.
U.S. application Ser. No. 07/585,771 Filed Sep. 20, 1990.
U.S. application Ser. No. 07/469,346 Filed Jan. 24, 1990.
U.S. application Ser. No. 07/488,874 Filed Mar. 6, 1990.
U.S. application No. 07/481,179 Filed Feb. 20, 1990.

Terada et al., *IEEE Journal of Solid-Sate Circuits* Feb. (1988) 23(1):86-90.

*Primary Examiner*—James B. Mullins
*Attorney, Agent, or Firm*—Morrison & Foerster

[57] ABSTRACT

In the normal selfrefresh mode, the timer output selection circuit selects the timer output of a longer cycle from the timer outputs generated by the internal timer circuit, and the selected timer output supplied as an operation activation signal for the selfrefresh operation. Using this long timer output, the self-refresh operation of DRAM cells in the memory device is performed with a low operating current which allows the memory device to be backed up by a battery. When the selfrefresh mode is set before the store operation, the timer output of a short cycle is selected from the timer outputs generated by the internal timer circuit, and the short timer output is supplied as an operation activation signal for the selfrefresh operation. Using this short timer output, the selfrefresh operation of the volatile memory means is performed. Therefore, a drop in the potential of the volatile memory portions caused by a leakage current can be quickly compensated, thus ensuring that data can be correctly stored in the volatile memory means. In the selfrecall operation mode, the timer output of an medium cycle is selected from the timer outputs generated by the internal timer circuit, and the medium timer output is supplied as an operation activation signal for the selfcall operation. Since the selfrecall operation is performed using the medium timer output, the selfrecall operation is performed at a faster speed than the normal selfrefresh operation.

5 Claims, 4 Drawing Sheets

NONVOLATILE SEMICONDUCTOR MEMORY DEVICE

BACKGROUND OF THE INVENTION

1. Field of the Invention

The present invention relates to a semiconductor memory device, and more particularly to a non-volatile semiconductor memory device having memory cells each comprising volatile memory means (such as a DRAM cell) and nonvolatile memory means (such as an EEPROM cell).

2. Description of the Prior Art

A nonvolatile semiconductor memory comprises memory cells each arranged in a matrix form. Each of the memory cells has a combination of a DRAM cell $MC_3$ and an EEPROM cell $MC_4$ as shown in FIG. 7 (for example, Y. Terada et al, IEEE JOURNAL OF SOLID-STATE CIRCUITS, Vol. 23, No. 1, Feb., 1988). Hereinafter, such a nonvolatile semiconductor memory device is referred to as "an NVDRAM". In FIG. 7, $C_2$ is a DRAM capacitor, B is a bit line, CG is a control gate line, and $W_1$ and $W_2$ are first and second word lines, respectively. In the NVDRAM of FIG. 7, data is transferred between the DRAM cell $MC_3$ and $C_2$ and a external device through the bit line B. The EEPROM cell $MC_4$ is activated only when data in the DRAM cell $MC_3$ and $C_2$ is transferred to the EEPROM cell $MC_4$ ("store operation") or when data stored in the EEPROM cell $MC_4$ is transferred to the DRAM cell $MC_3$ and $C_2$ ("recall operation"). Once the data of the DRAM cell $MC_3$ and $C_2$ is stored in the EEPROM cell $MC_4$, the EEPROM cell $MC_4$ retains the data stored therein, even when the power supply to the NVDRAM is turned off. This enables the data retained in the EEPROM cell $MC_4$ to be recalled to the DRAM cell $MC_3$ and $C_2$ when the power is turned on again.

In the NVDRAM, the selfrefresh and selfrecall operations must be performed at a predetermined time interval, respectively. The timings of the selfrefresh and selfrecall operations are controlled by the output of an internal timer circuit, in the same manner as the selfrefresh operation in a pseudo SRAM. In order to reduce the current level for the selfrefresh operation, such an internal timer circuit is generally designed so that the output has a predetermined constant long cycle, thereby enabling the battery backup.

FIG. 6 illustrates an internal timer circuit used in a conventional NVDRAM. The internal timer circuit of FIG. 6 comprises an oscillator 61, and a plurality of $\frac{1}{2}$ frequency dividers $62_1$-$62_n$ which are connected in series. The output of the oscillator 61 (frequency: $f_s$) is coupled to the input of the first $\frac{1}{2}$ frequency divider $62_1$. The last $\frac{1}{2}$ frequency divider $62_n$ outputs a signal of a long cycle (frequency: $f_s/2^n$), which is in turn supplied as an operation activation signal for the selfrefresh and selfrecall operations.

However, in a prior art NVDRAM, when the selfrefresh operation is performed before the store operation using the long-cycle timer output, a current leaks from the DRAM cell $MC_3$ and $C_2$ to cause a drop in the potential of the DRAM cell $MC_3$. This often results in that data cannot be correctly stored into the EEPROM cell $MC_4$. Furthermore, the use of the long-cycle timer output in the selfrecall operation required a prolonged period of time for performing the selfrecall operation.

SUMMARY OF THE INVENTION

The semiconductor memory device of this invention, which overcomes the above-discussed and numerous other disadvantages and deficiencies of the prior art, comprises: a plurality of memory cells each of which comprises volatile memory means and nonvolatile memory means; and a plurality of word lines, and further comprises: an internal timer circuit for generating at least two timer outputs, the cycles of said timer outputs being different to each other; and a timer output selection circuit for receiving said timer outputs, and for selectively supplying one of said timer outputs as a word line activation signal.

In preferred embodiments, each of said memory cells further comprises switch means for transferring data between said volatile memory means and said nonvolatile memory means.

In preferred embodiments, said volatile memory means are to be refreshed before store operation, said timer output selection circuit supplies one of said timer outputs, the cycle of said one timer output being shortest among the cycles of said timer outputs.

In preferred embodiments, said timer output selection circuit receives a selfrefresh before store enable signal, and a selfrecall enable signal.

In preferred embodiments, when said selfrefresh before store enable signal is active and said selfrecall enable signal is not active, said timer output selection circuit supplies one of said timer outputs, the cycle of said one timer output being shortest among the cycles of said timer outputs.

Thus, the invention described herein makes possible the objectives of:

(1) providing a semiconductor memory device in which the store operation can be reliably performed; and (2) providing a semiconductor memory device in which the selfrecall operation can be quickly performed.

According to the invention, in the normal selfrefresh mode, the timer output selection circuit selects the timer output of a longer cycle (hereinafter, "long timer output") from the timer outputs generated by the internal timer circuit, and the selected timer output is supplied as a selfrefresh operation activation signal. Using this long timer output, the selfrefresh operation of the volatile memory means such as DRAM cells in the memory device is performed with a low operating current which allows the memory device to be backed up by a battery.

When the selfrefresh mode is set before the store operation, the timer output selection circuit selects the timer output of a short cycle (hereinafter, "short timer output") from the timer outputs generated by the internal timer circuit, and the selected timer output is supplied as a selfrefresh operation activation signal. Using this short timer output, the selfrefresh operation of the volatile memory means is performed. Therefore, a drop in the potential of the volatile memory portions caused by a leakage current can be quickly compensated, thus ensuring that data can be correctly stored in the nonvolatile memory means.

In the selfrecall operation mode, the timer output selection circuit selects the timer output of an medium cycle (hereinafter, "medium timer output") from the timer outputs generated by the internal timer circuit, and the selected timer output is supplied as a selfrefresh operation activation signal. Since the selfrecall operation is performed using the medium timer output, the selfrecall operation is performed at a faster speed than the normal selfrefresh operation.

Alternatively, the cycle of the medium timer output may be the same as that of the short timer output. In other words, the short timer output may be used for the selfrecall operation, instead of the medium timer output.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
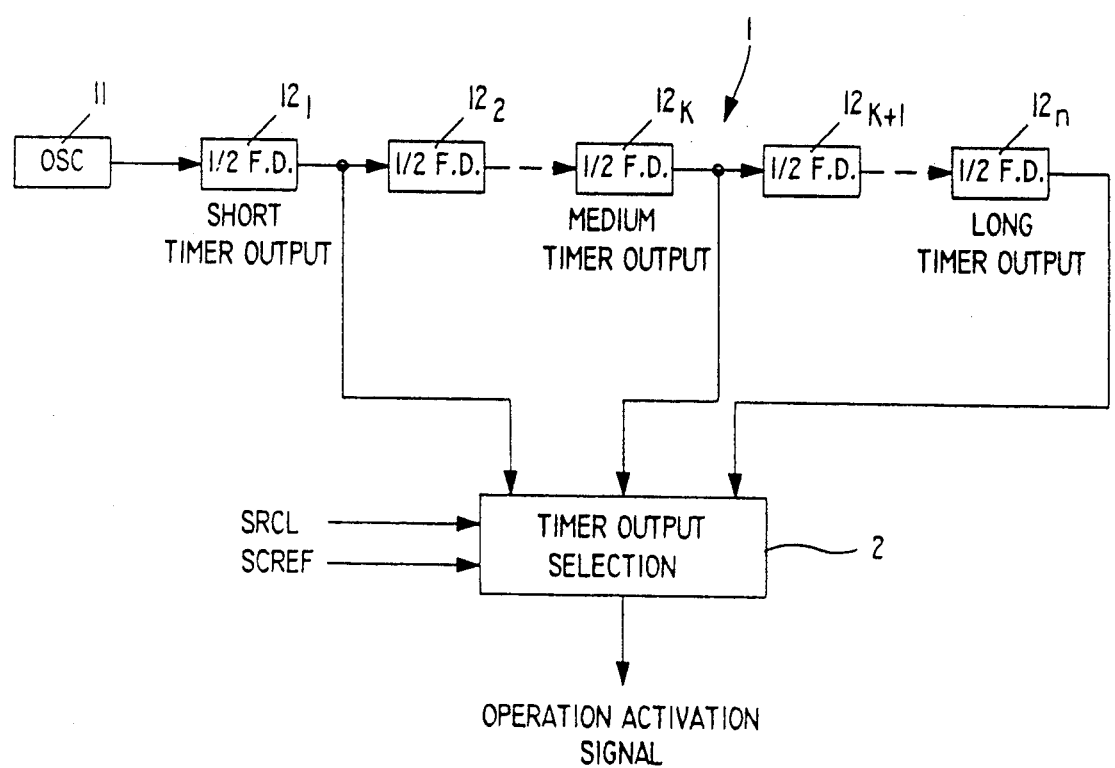
FIG. 1 is a block diagram illustrating one embodiment of the invention.

FIG. 1 illustrates an internal timer circuit 1 and timer output selection circuit 2 which are used in an NVDRAM according to the invention.

Figure 2:
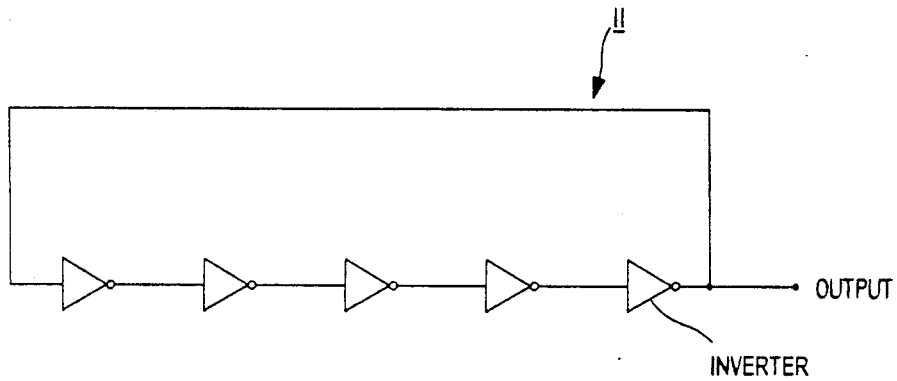
FIG. 2 is a circuit diagram illustrating an oscillator in an internal timer circuit used in the embodiment of FIG. 1.
Figure 3:
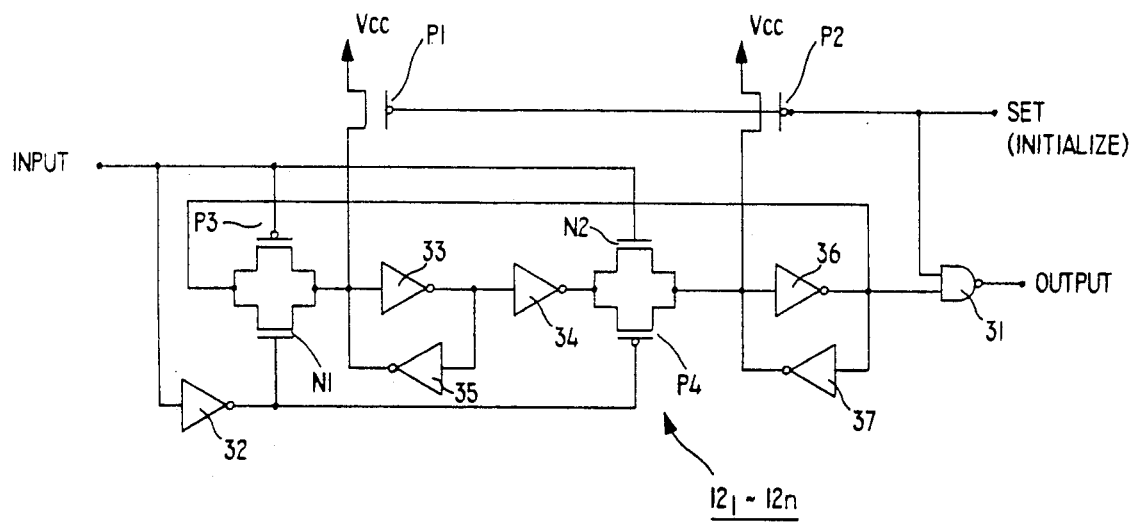
FIG. 3 is a circuit diagram illustrating a frequency divider in the internal timer circuit used in the embodiment of FIG. 1.
Figure 4:
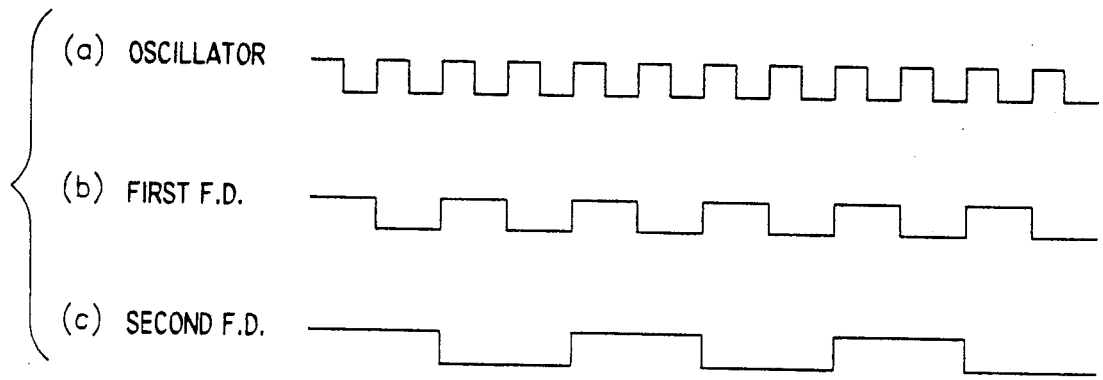
FIG. 4 shows waveforms of signals generated in the internal timer circuit used in the embodiment of FIG. 1.

The internal timer circuit 1 shown in FIG. 1 comprises an oscillator 11, and a plurality of ½ frequency dividers $12_1$-$12_n$ which are connected in series. As shown in FIG. 2, the oscillator 11 comprises five inverters connected in series. The output of the last inverter is delivered as an oscillator output, and also supplied to the first inverter to form a feedback loop. FIG. 3 illustrates the ½ frequency dividers $12_1$-$12_n$. Each of the ½ frequency dividers has a NAND gate 31, P-channel MOS transistors P1-P4, N-channel MOS transistors N1 and N2, and inverters 32-37. The waveforms of the outputs of the 11, and first and second ½ frequency dividers $12_1$ and $12_2$ are shown in (a) to (c) of FIG. 4, respectively. The output of the oscillator 11 (frequency: $f_s$) is coupled to the input of the first ½ frequency divider $12_1$. The output of the first ½ frequency divider $12_1$ (frequency: $f_s/2$) is supplied as the short timer output to the timer output selection circuit 2. The output of the kth ½ frequency divider $12_k$ (frequency: $f_s/2^k$, $1<k<n$) is supplied as the medium timer output to the timer output selection circuit 2. The output of the last ½ frequency divider $12_n$ (frequency: $f_s/2^n$) is supplied as the long timer output to the timer output selection circuit 2.

In addition to the above-mentioned three timer outputs, two signals are supplied to the timer output selection circuit 2 from other adequate circuitry in the NVDRAM. The first one is a selfrecall enable signal SRCL, and second one is a short cycle selfrefresh enable signal SCREF indicative that the selfrefresh operation is to be performed before the store operation. The short cycle selfrefresh enable signal SCREF can be generated by the circuitry described in the commonly-owned copending U.S. patent application Ser. No. 07/694,289 filed on Apr. 30, 1991 and entitled "A SEMICONDUCTOR MEMORY DEVICE," which is incorporated herein by reference.

Figure 5:
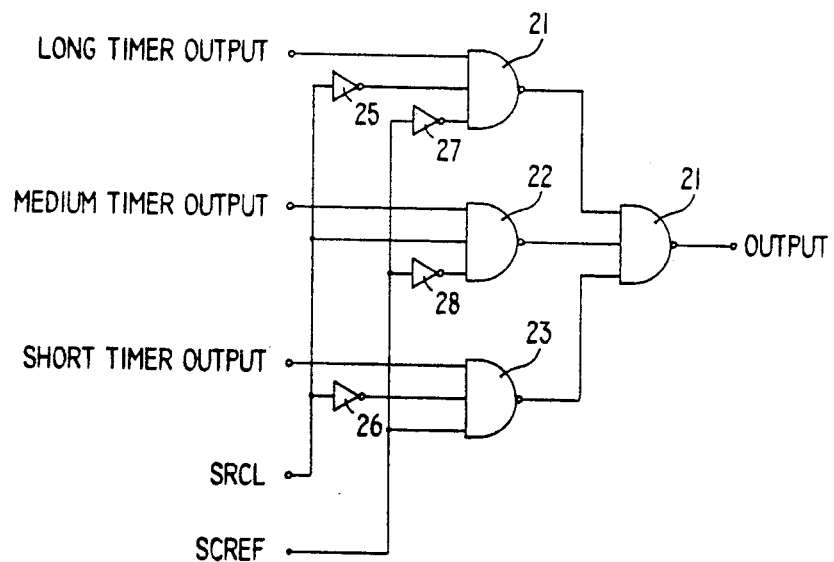
FIG. 5 is a circuit diagram illustrating a timer output selection circuit used in the embodiment of FIG. 1.
Figure 6:
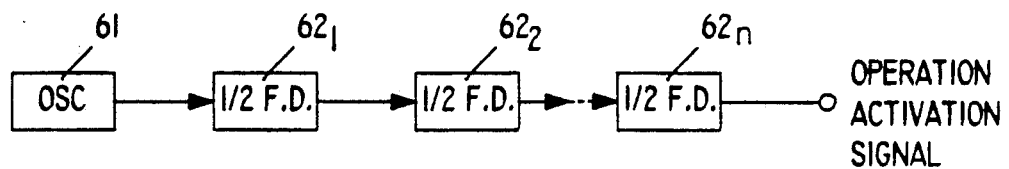
FIG. 6 is a block diagram illustrating an internal timer circuit used in a prior art NVDRAM.
Figure 7:
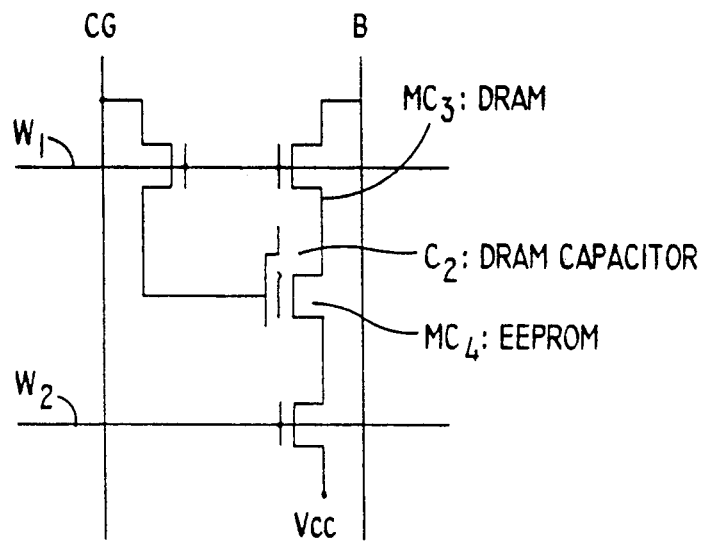
FIG. 7 illustrates a memory cell in a prior art NVDRAM.

FIG. 5 illustrates the timer output selection circuit 2. The timer output selection circuit 2 comprises four three-input NAND gates 21-24, and four inverters 25-28. The long, medium and short timer outputs are directly supplied to the NAND gates 21-23, respectively. The selfrecall enable signal SRCL is supplied to the NAND gate 21 via the inverter 25, directly to the NAND gate 22, and to the NAND gate 23 via the inverter 26. The short cycle selfrefresh enable signal SCREF is supplied to the NAND gate 21 via the inverter 27, to the NAND gate 22 via the inverter 28, and directly to the NAND gate 23. The outputs of the NAND gates 21-23 are coupled to the inputs of the NAND gate 24. The output of the NAND gate 24 is supplies as an operation activation signal for the selfrefresh and selfrecall operations. When both the selfrecall enable signal SRCL and short cycle selfrefresh enable signal SCREF are LOW, the NAND gate 24 outputs the long timer output. When the selfrecall enable signal SRCL is HIGH and the short cycle selfrefresh enable signal SCREF is LOW, the NAND gate 24 outputs the medium timer output. When the selfrecall enable signal SRCL is LOW and the short cycle selfrefresh enable signal SCREF is HIGH, the NAND gate 24 outputs the short timer output.

When the normal selfrefresh operation is to be performed, both the selfrecall enable signal SRCL and short cycle selfrefresh enable signal SCREF are set LOW, and the timer output selection circuit 2 receiving the two signals selectively outputs the long timer output as an operation activation signal. On the basis of the long timer output, the normal selfrefresh operation of the DRAM cells of the NVDRAM is performed with a low operating current, thereby enabling the battery backup.

When the selfrefresh operation before the store operation is to be performed, the selfrecall enable signal SRCL is set LOW and the short cycle selfrefresh enable signal SCREF is set HIGH, and the timer output selection circuit 2 selectively outputs the short timer output as an operation activation signal. On the basis of the short timer output, the selfrefresh operation of the DRAM cells of the NVDRAM is performed before the store operation. Since the selfrefresh operation before the store operation is performed using the timer output of a short cycle, a drop in the potential of the DRAM cells which is caused by current leakage from the DRAM cells can be quickly compensated. This enables the data to be correctly stored in the EEPROM cells, and hence ensures a reliable store operation.

When the selfrecall operation is to be performed, the selfrecall enable signal SRCL is set HIGH and the short cycle selfrefresh enable signal SCREF is set LOW, and the timer output selection circuit 2 selectively outputs the medium timer output as an operation activation signal. On the basis of the medium timer output, the selfrecall operation is performed to recall the data stored in the EEPROM cells to the DRAM cells. According to the embodiment, therefore, the selfrecall operation can be performed at a faster speed than the normal selfrefresh operation.

In the above-described embodiment, the internal timer circuit 1 generates three kinds of timer outputs. Alternatively, the internal timer circuit 1 may generate two kinds of timer outputs (i.e., the long timer output and the short timer output). In this case, when the selfrecall operation is to be performed, the timer output selection circuit 2 selects the short timer output to be used in the selfrecall operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising: a plurality of memory cells each of which comprises volatile memory means and nonvolatile memory means; and a plurality of word lines,
    said semiconductor memory device further comprising:
    an internal timer circuit for generating at least two timer outputs, the cycles of said timer outputs being different to each other; and
    a timer output selection circuit for receiving said timer outputs, and for selectively supplying one of said timer outputs to said word lines as a word line activation signal.

2. A semiconductor memory device according to claim 1, wherein, when said volatile memory means are to be refreshed before a store operation, said timer output selection circuit supplies one of said timer outputs, the cycle of said one timer output selected being shortest among the cycles of said timer outputs.

3. A semiconductor memory device according to claim 1, wherein said timer output selection circuit receives a selfrefresh signal before receiving a store enable signal and a selfrecall enable signal.

4. A semiconductor memory device according to claim 3, wherein, when said selfrefresh signal is received before said store enable signal is active and said selfrecall enable signal is not active, said timer output selection circuit supplies one of said timer outputs, the cycle of said one timer output being shortest among the cycles of said timer outputs.

5. A semiconductor memory device comprising: a plurality of memory cells each of which comprises volatile memory means and nonvolatile memory means; and a plurality of word lines,
    said semiconductor memory device further comprising:
    an internal timer circuit for generating at least two timer outputs, the cycles of said timer outputs being different to each other; and
    a timer output selection circuit for receiving said timer outputs, and for selectively supplying one of said timer outputs to said word lines as a word line activation signal;
    each of said memory cells further comprises switch means for transferring data between said volatile memory means and said nonvolatile memory means.

* * * * *

UNITED STATES PATENT AND TRADEMARK OFFICE
CERTIFICATE OF CORRECTION

PATENT NO. : 5,287,319

DATED : February 15, 1994

INVENTOR(S) : K. Fukumoto

It is certified that error appears in the above-identified patent and that said Letters Patent is hereby corrected as shown below:

In the Drawings:

In FIG. 5 the reference number "21" closest to "OUTPUT" should be --24--.

Signed and Sealed this

Ninth Day of August, 1994

Attest:

BRUCE LEHMAN

*Attesting Officer*   *Commissioner of Patents and Trademarks*